United States Patent
Sievert et al.

(10) Patent No.: US 10,972,085 B2
(45) Date of Patent: Apr. 6, 2021

(54) PHASE INTERPOLATOR, APPARATUS FOR PHASE INTERPOLATION, DIGITAL-TO-TIME CONVERTER, AND METHODS FOR PHASE INTERPOLATION

(71) Applicant: Intel IP Corporation, Santa Clara, CA (US)

(72) Inventors: Sebastian Sievert, Munich (DE); Sarit Zur, Petah-Tikva M (IL); Ofir Degani, Nes-Ammin (IL); Rotem Banin, Even-Yehuda (IL)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 15/811,730

(22) Filed: Nov. 14, 2017

(65) Prior Publication Data

US 2018/0175842 A1 Jun. 21, 2018

(30) Foreign Application Priority Data

Dec. 21, 2016 (EP) ..................... 16205835

(51) Int. Cl.
| | | |
|---|---|---|
| H03K 5/151 | (2006.01) | |
| H03K 5/131 | (2014.01) | |
| H03K 5/00 | (2006.01) | |
| H03M 1/68 | (2006.01) | |
| H03M 1/82 | (2006.01) | |

(52) U.S. Cl.
CPC ........... *H03K 5/1515* (2013.01); *H03K 5/131* (2013.01); *H03M 1/687* (2013.01); *H03K 2005/00052* (2013.01); *H03M 1/82* (2013.01)

(58) Field of Classification Search
CPC ....... H03M 1/66; H03K 5/131; H03K 5/1515; H03K 2005/00052
See application file for complete search history.

(56) References Cited

U.S. PATENT DOCUMENTS

| | | | |
|---|---|---|---|
| 8,004,328 B2 * | 8/2011 | Kim | ......................... H03K 5/13 327/149 |
| 8,995,600 B1 | 3/2015 | Gopalakrishnan et al. | |
| 9,137,084 B2 * | 9/2015 | Degani | ................... H04L 27/36 |
| 9,407,245 B2 | 8/2016 | Sievert et al. | |
| 2017/0093556 A1 | 3/2017 | Degani et al. | |

OTHER PUBLICATIONS

Hae-Chang Lee: "An estimaton approach to clock and data recovery", Jan. 2007.
Nidhi Nitin et al: "A 1.8GHz wideband open.loop phase modulator with TDC based non-linearity calibration in 0.13[micro]m CMOS", 2015 IEEE Radio Frequency Integrated Circuits Symposium.

* cited by examiner

*Primary Examiner* — Lincoln D Donovan
*Assistant Examiner* — Colleen J O Toole
(74) *Attorney, Agent, or Firm* — 2SPL Patent Attorneys PartG mbB; Yong Beom Hwang

(57) ABSTRACT

A phase interpolator is provided. The phase interpolator includes a plurality of first interpolation cells each configured to supply a first current to a common node of the phase interpolator. Further, the phase interpolator includes a plurality of second interpolation cells each configured to supply a second current to the common node. The second current is lower than the first current, wherein a sum of the plurality of second currents supplied to the common node by the plurality of second interpolation cells is substantially equal to the first current.

20 Claims, 12 Drawing Sheets

FIG. 3a
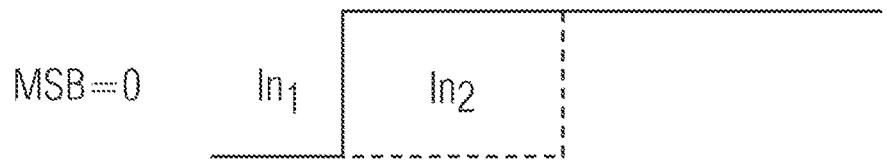
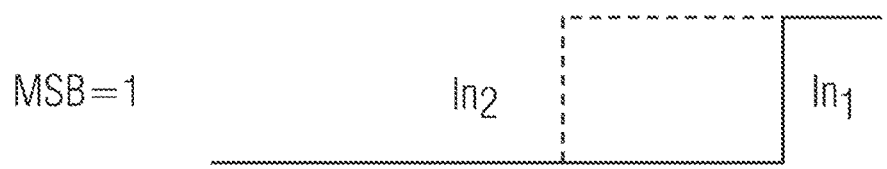
FIG. 3b
|  | Selected Input | | Weighting | | |
|---|---|---|---|---|---|
| Code | Cell 1 | Cell 2 | In1 | In2 | φ |
| 00 | In1 | In1 | 2 | 0 | 0° |
| 01 | In1 | In2 | 1 | 1 | 22.5° |
| 10 | In2 | In2 | 0 | 2 | 45° |
| 11 | In2 | In2 | 1 | 1 | 67.5° |
| 00* | In2 | In2 | 2 | 0 | 90° |
*further coarse tuning activity involved

FIG. 3c

| | Selected Input | | | Weighting | | |
|---|---|---|---|---|---|---|
| Code | Cell 1 | Cell 2 | $B_{1/2}$ | In1 | In2 | $\phi$ |
| 000 | In1 | In1 | In1 | 2.5 | 0.0 | 0° |
| 001 | In1 | In1 | In2 | 2.0 | 0.5 | 9° |
| 010 | In1 | In2 | In1 | 1.5 | 1.0 | 18° |
| 011 | In1 | In2 | In2 | 1.0 | 1.5 | 27° |
| ? | In2 | In2 | In1 | 0.5 | 2.0 | 36° |
| 100 | In2 | In2 | In2 | 0.0 | 2.5 | 45° |

FIG. 3d

| | Selected Input | | | Weighting | | |
|---|---|---|---|---|---|---|
| Code | Cell 1 | $B_{1/2}$ | $B_{1/2}$ | In1 | In2 | $\phi$ |
| 000 | In1 | In1 | In1 | 2.0 | 0.0 | 0° |
| 001 | In1 | In2 | In1 | 1.5 | 0.5 | 11.25° |
| 010 | In2 | In1 | In1 | 1.0 | 1.0 | 22.5° |
| 011 | In2 | In2 | In1 | 0.5 | 1.5 | 33.75° |
| 100 | In2 | In2 | In2 | 0.0 | 2.0 | 45° |

US 10,972,085 B2

PHASE INTERPOLATOR, APPARATUS FOR PHASE INTERPOLATION, DIGITAL-TO-TIME CONVERTER, AND METHODS FOR PHASE INTERPOLATION

FIELD

Examples relate to phase interpolation. In particular, examples relate to a phase interpolator, an apparatus for phase interpolation, a digital-to-time converter, and methods for phase interpolation.

BACKGROUND

A Digital-to-Time Converter (DTC) is in general a Digital-to-Analog Converter (DAC), wherein the analog domain is phase (i.e. time). It is commonly built in a segmented architecture, where a coarse tuning stage provides a coarse tuning of the signals' phase, and a subsequent fine tuning applies a high resolution phase tuning. For example, the fine tuning may be implemented using a phase interpolator which may provide a defined interpolation range, low power consumption, and low jitter. Phase interpolators are commonly implemented as an array of identical unit interpolation cells.

However, if the resolution of a phase interpolator needs to be increased by one bit, the number of unit cells has to be doubled. This leads to an almost doubling of the phase interpolator's power consumption for each bit of additional resolution. Also the area of the circuit increases by almost a factor of 2.

Hence, there may be a desire for an improved phase interpolation technique.

BRIEF DESCRIPTION OF THE FIGURES

Some examples of apparatuses and/or methods will be described in the following by way of example only, and with reference to the accompanying figures, in which

FIGS. 3a to 3d illustrate exemplary control of a phase interpolator with 1 bit resolution;

DETAILED DESCRIPTION

Figure 1:
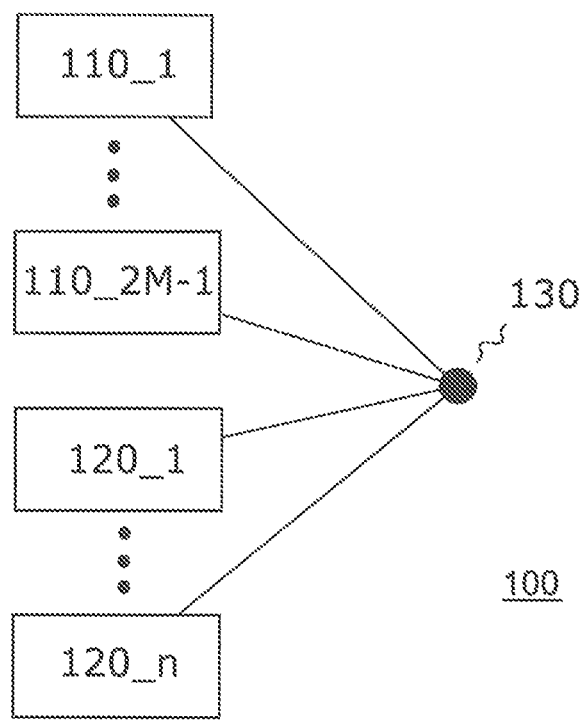
FIG. 1 illustrates an example of a phase interpolator.

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B as well as A and B. An alternative wording for the same combinations is "at least one of A and B". The same applies for combinations of more than 2 Elements.

The terminology used herein for the purpose of describing particular examples is not intended to be limiting for further examples. Whenever a singular form such as "a," "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

In the following, various examples relate to devices (e.g. cell phone, base station) or components (e.g. transmitter, transceiver) of devices used in wireless or mobile communications systems. A mobile communication system may, for example, correspond to one of the mobile communication systems standardized by the 3rd Generation Partnership Project (3GPP), e.g. Global System for Mobile Communications (GSM), Enhanced Data rates for GSM Evolution (EDGE), GSM EDGE Radio Access Network (GERAN), High Speed Packet Access (HSPA), Universal Terrestrial Radio Access Network (UTRAN) or Evolved UTRAN (E-UTRAN), LTE or LTE-Advanced (LTE-A), or mobile communication systems with different standards, e.g. Worldwide Interoperability for Microwave Access (WIMAX) IEEE 802.16 or Wireless Local Area Network (WLAN) IEEE 802.11, generally any system based on Time Division Multiple Access (TDMA), Frequency Division Multiple Access (FDMA), Orthogonal Frequency Division Multiple Access (OFDMA), Code Division Multiple Access (CDMA), etc. The terms mobile communication system and mobile communication network may be used synonymously.

The mobile communication system may comprise a plurality of transmission points or base station transceivers operable to communicate radio signals with a mobile transceiver. In these examples, the mobile communication system may comprise mobile transceivers, relay station transceivers and base station transceivers. The relay station transceivers and base station transceivers can be composed of one or more central units and one or more remote units.

A mobile transceiver or mobile device may correspond to a smartphone, a cell phone, User Equipment (UE), a laptop, a notebook, a personal computer, a Personal Digital Assistant (PDA), a Universal Serial Bus (USB)-stick, a tablet computer, a car, etc. A mobile transceiver or terminal may also be referred to as UE or user in line with the 3GPP terminology. A base station transceiver can be located in the fixed or stationary part of the network or system. A base station transceiver may correspond to a remote radio head, a transmission point, an access point, a macro cell, a small cell, a micro cell, a pico cell, a femto cell, a metro cell etc. The term small cell may refer to any cell smaller than a macro cell, i.e. a micro cell, a pico cell, a femto cell, or a metro cell. Moreover, a femto cell is considered smaller than a pico cell, which is considered smaller than a micro cell. A base station transceiver can be a wireless interface of a wired network, which enables transmission and reception of radio signals to a UE, mobile transceiver or relay transceiver. Such a radio signal may comply with radio signals as, for example, standardized by 3GPP or, generally, in line with one or more of the above listed systems. Thus, a base station transceiver may correspond to a NodeB, an eNodeB, a BTS, an access point, etc. A relay station transceiver may correspond to an intermediate network node in the communication path between a base station transceiver and a mobile station transceiver. A relay station transceiver may forward a signal received from a mobile transceiver to a base station transceiver, signals received from the base station transceiver to the mobile station transceiver, respectively.

The mobile communication system may be cellular. The term cell refers to a coverage area of radio services provided by a transmission point, a remote unit, a remote head, a remote radio head, a base station transceiver, relay transceiver or a NodeB, an eNodeB, respectively. The terms cell and base station transceiver may be used synonymously. In some examples a cell may correspond to a sector. For example, sectors can be achieved using sector antennas, which provide a characteristic for covering an angular section around a base station transceiver or remote unit. In some examples, a base station transceiver or remote unit may, for example, operate three or six cells covering sectors of 120° (in case of three cells), 60° (in case of six cells) respectively. Likewise a relay transceiver may establish one or more cells in its coverage area. A mobile transceiver can be registered or associated with at least one cell, i.e. it can be associated to a cell such that data can be exchanged between the network and the mobile in the coverage area of the associated cell using a dedicated channel, link or connection. A mobile transceiver may hence register or be associated with a relay station or base station transceiver directly or indirectly, where an indirect registration or association may be through one or more relay transceivers.

FIG. 1 illustrates a phase interpolator 100. The phase interpolator 100 comprises a plurality of first interpolation cells 110_1, ..., 110_2M−1 which are each configured to supply a first current to a common node 130 of the phase interpolator. Further, the phase interpolator comprises a plurality of second interpolation cells 120_1, ..., 120_n each configured to supply a (respective) second current to the common node 130. The second current is lower than the first current. A sum of the plurality of second currents supplied to the common node 130 by the plurality of second interpolation cells 120_1, ..., 120_n is (substantially) equal to the first current.

The phase interpolator 100 may provide a given phase resolution with a reduced number of interpolation cells. Compared to conventional phase interpolation concepts, a power consumption as well as a required chip area of the phase interpolator 100 may be reduced.

Each of the plurality of first interpolation cells 110_1, ..., 110_2M−1 and the plurality of second interpolation cells 120_1, ..., 120_n may receive a first signal and a second signal which may be identical but shifted by a time shift Δt. The plurality of first interpolation cells 110_1, ..., 110_2M−1 as well as the plurality of second interpolation cells 120_1, ..., 120_n may, based on a control word, further supply the first signal and/or the second signal to the common node 130. In this respect, the plurality of first interpolation cells 110_1, ..., 110_2M−1 and the plurality of second interpolation cells 120_1, ..., 120_n use different current strengths when supplying the first signal and/or the second signal to the common node 130.

A current supplied to the common node 130 may be integrated in its capacitance. Hence, the finer current steps at the common node 130 are, the higher the resolution of the phase interpolation between the first signal and the second signal may be. For example, the second current may be at maximum 50% of the first current. That is, the second interpolation cells 120_1, ..., 120_n supply currents to the common node 130 which are at maximum 50% of the first current as supplied by each of the a plurality of first interpolation cells 110_1, ..., 110_2M−1 to the common node 130. As a consequence, current steps with half increment or less of the first current may be achieved at the common node 130.

In some examples, the number of first interpolation cells 110_1, ..., 110_2M−1 may be greater than the number of second interpolation cells 120_1, ..., 120_n.

The plurality of second currents supplied by the plurality of second interpolation cells to the common node may be substantially equal to one another.

Alternatively, the respective second currents supplied by the plurality of second interpolation cells to the common node may be different. For example, the plurality of second interpolation cells 120_1, ..., 120_n may comprise two second interpolation cells configured to supply second currents to the common node that are $2^{-S}$ times the first current. S+1 is the number of second interpolation cells. The plurality of second interpolation cells 120_1, ..., 120_n may further comprise for each natural number Y being equal to or less than S−1 one respective second interpolation cell configured to supply a second current to the common node which is $2^{-Y}$ times the first current. Accordingly, second interpolation cells may be provided allowing for different current steps at the common node 130.

In some examples, the phase interpolator 100 may allow (M+N) bit phase resolution with less than $2^{M+N}$ interpolation cells. M and N are natural numbers (i.e. any numbers above zero without decimals). The plurality of first interpolation cells 110_1, ..., 110_2M−1 may, therefore, amount to $2^M-1$ first interpolation cells.

In some examples, the plurality of second interpolation cells 120_1, ..., 120_n may amount to $2^N$ second interpolation cells. The plurality of second currents supplied by the $2^N$ second interpolation cells to the common node 130 may be substantially equal to one another. In other words, each of the $2^N$ second interpolation cells may supply the same second current to the common node 130.

The phase interpolator 100 may further comprise a control circuit (not illustrated) to control the plurality of first interpolation cells 110_1, . . . , 110_2M-1 based on a number of most significant bits of a control word, and to control the plurality of second interpolation cells based on a number of least significant bits of the control word and a bit of the control word that indicates a direction of interpolation. For example, the control circuit may be configured to control the $2^M-1$ first interpolation cells 110_1, . . . , 110_2M-1 based on the M most significant bits of a control word, and to control the $2^N$ second interpolation cells based on the N least significant bits of the control word and a bit of the control word that indicates a direction of interpolation. The control word may, e.g., comprise M+N bits in total. The bit of the control word that indicates the direction of interpolation may be any bit used to indicate which one of the first signal and the second signal (as received by the first interpolation cells as well as the second interpolation cells) is leading the other one of the first signal and the second signal in the time domain. For example, the bit of the control word which indicates the direction of interpolation may be the Most Significant Bit (MSB) of the control word.

The control circuit may, e.g., be configured to control a first second interpolation cell based on the bit of the control word that indicates the direction of interpolation, and to control a second second interpolation cell based on a combination of the number of least significant bits of the control word and the bit of the control word that indicates the direction of interpolation. For example, the control circuit maybe configured to control one of the $2^N$ second interpolation cells based on the bit of the control word which indicates the direction of interpolation (e.g. the MSB), and to control the other ones of the $2^N$ second interpolation cells based on a combination of the N least significant bits of the control word and the bit of the control word which indicates the direction of interpolation.

Alternatively, the plurality of second interpolation cells 120_1, . . . , 120_n may amount to N+1 second interpolation cells. The respective second currents supplied by the N+1 second interpolation cells to the common node 130 may be different.

For example, the N+1 second interpolation cells may comprise two second interpolation cells configured to supply second currents to the common node that are $2^{-N}$ times the first current. The N+1 second interpolation cells may further comprise for each natural number Y (e.g. 1, 2, 3, . . . ) being equal to or less than N-1 one respective second interpolation cell configured to supply a second current to the common node which is $2^{-Y}$ times the first current. Accordingly, second interpolation cells may be provided allowing for different current steps at the common node 130.

A control circuit (not illustrated) of the phase interpolator 100 may, e.g., be configured to control the plurality of first interpolation cells based on a number of most significant bits of a control word, and to control the plurality of second interpolation cells based on a number of least significant bits of the control word and a bit of the control word that indicates a direction of interpolation. For example, the control circuit maybe configured to control the $2^M-1$ first interpolation cells based on the M most significant bits of a control word, and to control the N+1 second interpolation cells based on the N least significant bits of the control word and a bit of the control word which indicates a direction of interpolation.

For example, the control circuit may be configured to control a first second interpolation cell based on the bit of the control word that indicates the direction of interpolation, and to control a second second interpolation cell based on the number of least significant bits of the control word. In some examples, the control circuit may, e.g., be configured to control a first second interpolation cell based on the bit of the control word that indicates the direction of interpolation, and to control a second second interpolation cell based on the number of least significant bits of the control word. For example, the control circuit may be configured to control one of the N+1 second interpolation cells based on the bit of the control word that indicates the direction of interpolation, and to control the N others of the N+1 second interpolation cells based on the N least significant bits of the control word. The second interpolation cells which is controlled based on the bit of the control word which indicates the direction of interpolation may, e.g., be the second interpolation cell supplying the lowest current to the common node 130.

In example for controlling the first and the second interpolation cells for a phase interpolator with (7+2) bits resolution is illustrated in the following table 1:

TABLE 1

Exemplary control

| Code | | Case (a) | | | | Case (b) | | |
|---|---|---|---|---|---|---|---|---|
| | | $B_{1/4}$ | $B_{1/4}$ | $B_{1/4}$ | $B_{1/4}$ | $B_{1/2}$ | $B_{1/4}$ | $B_{1/4}$ |
| 0111101 | 11 | 1 | 1 | 1 | 0 | 1 | 1 | 0 |
| 0111110 | 00 | 0 | 0 | 0 | 0 | 0 | 0 | 0 |
| 0111110 | 01 | 1 | 0 | 0 | 0 | 0 | 1 | 0 |
| 0111110 | 10 | 1 | 1 | 0 | 0 | 1 | 0 | 0 |
| 0111110 | 11 | 1 | 1 | 1 | 0 | 1 | 1 | 0 |
| 0111111 | 00 | 0 | 0 | 0 | 0 | 0 | 0 | 0 |
| 0111111 | 01 | 1 | 0 | 0 | 0 | 0 | 1 | 0 |
| 0111111 | 10 | 1 | 1 | 0 | 0 | 1 | 0 | 0 |
| 0111111 | 11 | 1 | 1 | 1 | 0 | 1 | 1 | 0 |
| 1000000 | 00 | 1 | 1 | 1 | 1 | 1 | 1 | 1 |
| 1000000 | 01 | 0 | 1 | 1 | 1 | 1 | 0 | 1 |
| 1000000 | 10 | 0 | 0 | 1 | 1 | 0 | 1 | 1 |
| 1000000 | 11 | 0 | 0 | 0 | 1 | 0 | 0 | 1 |
| 10000001 | 00 | 1 | 1 | 1 | 1 | 1 | 1 | 1 |
| therm. | bin. | | | | | | | |

That is, the phase interpolator may comprise $2^7-1$ first interpolation cells as well as $2^2=4$ second interpolation cells supplying the same second current to the common node for case a), or 2+1=3 second interpolation cells supplying different second currents to the common node for case b). Interpolation cells programmed to "0" may, e.g., select the first (input) signal, whereas cells programmed to "1" may select the second (input) signal and provide it to the common node. The bold MSB $d_8$ indicates the direction of interpolation, i.e., which of the two input signals is leading/trailing with respect to the other. The first and second input signals for the interpolation cells may, e.g., be provided by a coarse tuning stage of a DTC, wherein the coarse tuning stage may flip the temporal order of the input signals. This may ensure monotonicity and low Differential Non-Linearity (DNL)

The 7 most significant bits $d_8$ to $d_2$ control the first interpolation cells. For example, the first interpolation cells may be arranged in a thermometric array.

For case a) one of the four second interpolation cells is directly controlled by MSB $d_8$, whereas the two least significant bits of the control word are XORed with the MSB $d_8$ and are converted binary-to-thermometric in order to control the remaining three second interpolation cells. For case b) one of the three second interpolation cells is directly controlled by MSB $d_8$, whereas the two least significant bits of the control word directly control the two remaining second interpolation cells.

Generally speaking, some examples relate to a means for phase interpolation with (M+N) bit resolution. The means for phase interpolation comprises a plurality of first cellular means for supplying a first current to a common node of the means for phase interpolation, respectively. Further, the means for phase interpolation comprises a plurality of second cellular means for supplying a second current to the common node, respectively. The second current is lower than the first current. A sum of the plurality of second currents supplied to the common node by the plurality of second cellular means is (substantially) equal to the first current.

The number of first cellular means may, e.g., be greater than the number of second cellular means.

The means for phase interpolation may be implemented by a phase interpolator described above or below (e.g. FIG. 1). The first cellular means may be implemented by first interpolation cells described above or below (e.g. FIG. 1). The second cellular means may be implemented by second interpolation cells described above or below (e.g. FIG. 1).

Summarizing the above, conventional phase interpolators may implement $2^m$ thermometrically controlled unit interpolation cells in an array in order to achieve m bit phase resolution. As doubling the resolution with an additional bit doubles also the array size, binary cell extensions for fine resolution may be used as discussed above. The thermometrically controlled interpolation unit cells may be referred to as 'unit cells' (or first interpolation cells), and the binary extended interpolation cells as 'binary cells' (or second interpolation cells). For example, a dedicated mix of thermometrically and binary controlled cells in a cell array may be used. A thermometrically controlled cell may be "replaced" by an equivalent amount of binary cells, leading to a dedicated field of thermometrically and binary controlled cells for phase interpolator cell fields: $T_{cell} = \Sigma_{i=0}^{k} B_{1/(k+1)}$, $k \in N^+$. The resolution of a phase interpolator may be increased by implementing interpolation cells that drive, e.g., half or quarter of the current of the nominal interpolation cell and use them in the segmented architecture mentioned above.

A dedicated thermometer/binary segmentation may allow to prevent missing programming codes. Phase interpolators cover a range from zero to full scale. Phase interpolators with m bit must have $2^m+1$ states (0 to $2^m$) to enable continuous phase change in, e.g., a DTC. The unit interpolation cells have to select either one of the input signals and cannot be turned off. The phase interpolators "gain" is determined by the time shift $\Delta t$ between the input signals. The binary cells may, e.g., be implemented as thermometrically controlled cells, which are bounded by the phase spacing of the interpolator input signals, which is one major benefit of phase interpolators.

The control circuit of a phase interpolator needs to assure that two neighboring codes will only change the phase of the output signal (i.e. the interpolated signal) by one Least Significant Bit (LSB) of the control word. If the binary bits are simply were added to an existing array of $2^m$ unit cells, e.g., a $B_{1/2}$ cell with half the weighting of a unit cell is added to an existing array, the existing states of the array would exceed the ideal number of ($2^m+1$) states that can be programmed. This results from the fact, that interpolation cells select either one input or another, but cannot be turned off or put in a high-Z state. For a correct implementation one unit cell is removed from the array, and replaced by an equivalent of binary cells. The following two examples highlight this principle for a (X+1) bit binary extension.

As discussed already above, a thermometrically controlled binary cell extension may be achieved if one unit cell is replaced by $2^{X+1}$ binary cells with the weighting ½. Further, a binary controlled binary cell extension may be achieved by two cells of the size $½^{X+1}$, and additional X cells with the size $½^Y \forall \{Y \in N \wedge Y \leq X\}$. For example, for a one bit binary extension (i.e. X=0), one unit cell may be removed and replaced by two binary cells with ½ weighting. For example, for a two bit binary extension (i.e. X=1), one unit cell may be removed and replaced by one binary cell with ½ weighting, and two binary cells with ¼ weighting. For example, for a three bit binary extension (i.e. X=2), one unit cell may be removed and replaced by one binary cell with ½ weighting, one binary cell with ¼ weighting, and two binary cells with ⅛ weighting. In general, any cell Z (binary or thermometric) may be replaced by two cells $Z_{1/2}$ with half the original driving strength. Recursive application of this method may lead to both example cases from the last paragraph.

Figures 2A, 2B:
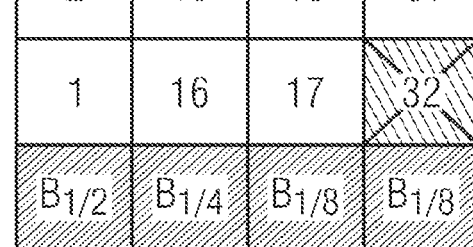
FIGS. 2a and 2b illustrate different examples of phase interpolator cell arrays.

An example of a conventional phase interpolator 200 with 5 bit resolution is illustrated in FIG. 2a. The conventional phase interpolator 200 comprises $2^5=32$ unit cells. A phase interpolator 210 according to the proposed concept is illustrated in FIG. 2b. The phase interpolator 210 enables (5+3)=8 bit resolution. The phase interpolator 210 comprises $2^5-1=31$ unit cells (i.e. first interpolation cells) and 3+1=4 binary cells (i.e. second interpolation cells). Two binary cells are weighted ⅛ (i.e. $2^{-3}$) of a unit cell, one binary cell is weighted ¼ of a unit cell, and one binary cell is weighted ½ of a unit cell. That is, the cell array of the phase interpolator 210 may be considered as extended by 3 binary bits in binary controlled binary cell extension fashion compared to the conventional phase interpolator 200.

An example for controlling a phase interpolator with 1 bit resolution is discussed in the following with respect to FIGS. 3a to 3d. FIG. 3a illustrates that the MSB of the control word indicates the direction of interpolation. If the MSB is zero, the first (input) signal leads the second (input) signal. If the MSB is one, the second (input) signal leads the first (input) signal. It is evident from FIG. 3b that the m=1 bit phase interpolator (comprising two unit cells) leads to ($2^m+1$)=3 states (the MSB does not count to the phase interpolator bits). In FIG. 3c, the phase interpolator is extended with X=1 by one binary bit in a conventional way (i.e. the array comprises $2^m=2^1$ unit cells and one binary cell), leading to the problem of more physical than control states. Control as discussed above is illustrated in FIG. 3d, where one of the unit cells is replaced by two binary cell with weighting ½. Here, the number of physical states is equal to the number of control states.

For example, one of the $½^{X+1}$ binary cells (there are at least two of this size) may be controlled directly by the MSB, while the other may be controlled by control signal $b_0 = d_0 \oplus MSB$. For X=(1+k), $k \in N^+$ this may be extended to $b_{k:0} = d_{k:0} \oplus MSB$. Depending on the implementation, $b_{k:0}$ may control the binary cells directly, or it may be converted to a thermometer coded control (see above). The inversion of $d_{k:0}$ with an XOR gate may ensure correct wrap around when the temporal order of the input signals switches and the array changes between backwards and forwards operation (interpolation). This may ensure continuous phase change.

Figure 4:
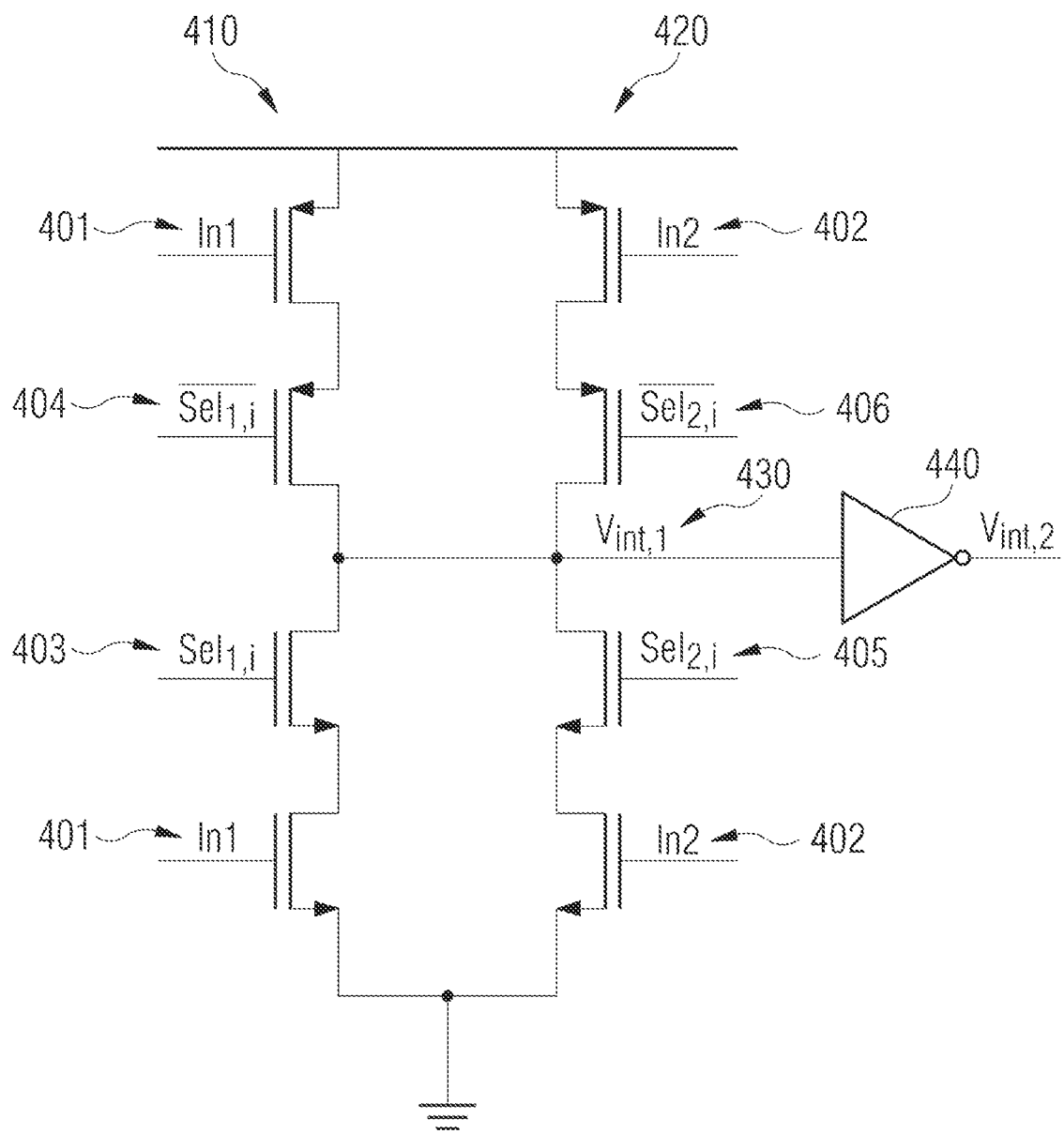
FIG. 4 illustrates an example of an interpolation cell.

FIG. 4 illustrates an example of an interpolation cell 400 (e.g. a first interpolation cell, a second interpolation cell, a unit cell, or a binary cell). The interpolation cell 400 comprises a first inverter circuit 410 configured to supply an inverted first signal to an internal node 430 of the interpolation cell 400 based on a first (input) signal 401, a first selection signal 403 and a second selection signal 404. Further, the interpolation cell 400 comprises a second inverter circuit 420 configured to supply an inverted second signal to the internal node 430 based on a second (input) signal 402, a third selection signal 405 and a fourth selection signal 406. The selection signals 403, . . . , 406 are selected based on a control word for a phase interpolator containing the interpolation cell 400. An output inverter 440 inverts the resulting waveform at the internal node 430 and supplies it to a common node of the phase interpolator to which all interpolation cells of the phase interpolator are connected to. That is, the output inverter 440 drives the common node of the phase interpolator.

Figure 5:
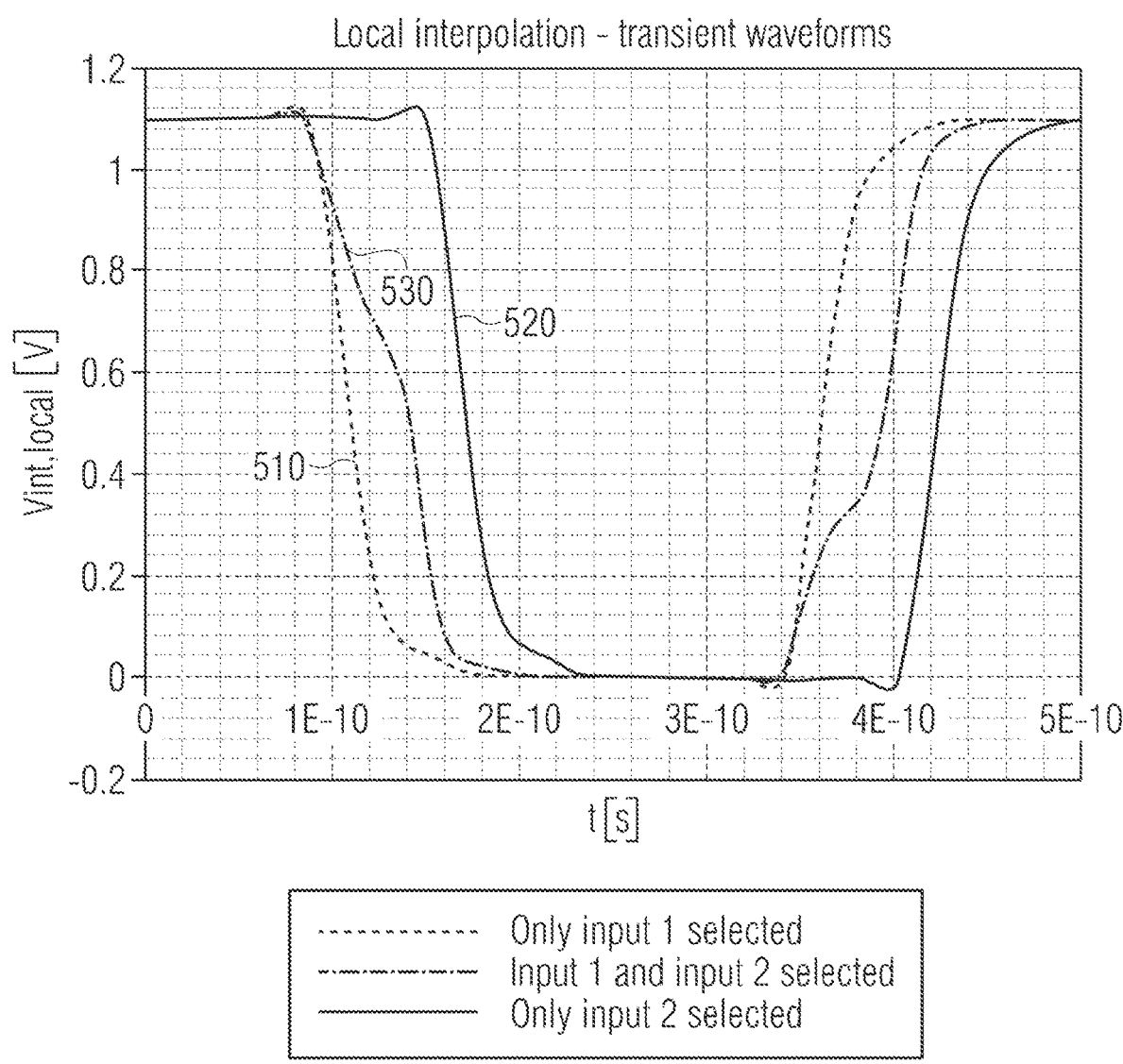
FIG. 5 illustrates exemplary waveforms supplied by an interpolation cell to the common node.

Exemplary waveforms at the internal node 430, or the common node of the phase interpolator are illustrated in FIG. 5. If only the first signal 401 is selected (i.e. the first selection signal 403 and the second selection signal 404 drive the transistors of the first inverter circuit 410 to a conductive state), a first waveform 510 is present at the internal node 430, or the common node of the phase interpolator. If only the second signal 402 is selected (i.e. the third selection signal 405 and the fourth selection signal 406 drive the transistors of the second inverter circuit 420 to a conductive state), a second waveform 520 is present at the internal node 430, or the common node of the phase interpolator. If the first signal 401 and the second signal 402 are selected, a third waveform 530 is present at the internal node 430, or the common node of the phase interpolator. It is evident from FIG. 5 that the third waveform 530 lies in the time domain in the middle between the first waveform 510 and the second waveform 520. Hence, FIG. 5 illustrates the interpolation effect of the interpolation cell 400, which allows interpolation with a resolution which is equal to about half the timely distance between the first signal 401 and the second signal 402.

The further (second) interpolation at the common node of the phase interpolator is split in two regions: either interpolation between the first waveform 510 and the third waveform 530, or between the third waveform 530 and the second waveform 520. The second interpolation weights how many interpolation cells are configured for one or the other signal. The interpolation cell array may operate symmetrically forward and backward for the respective region to ensure continuous phase change and monotonicity.

As discussed above, the weighting of the input signals is implemented as driving of an equivalent current into the second interpolation node and integrating it in its capacitance. That is, the finer the current steps are, the higher the resolution of the phase interpolator may be. The proposed introduction of binary cells (second interpolation cells) may allow a smaller output current compared to the unit cells (first interpolation cells). To achieve a finer current, the unit cell's output driving stage, i.e., the last inverter in the unit cell that drives the common node of the phase interpolator, may, e.g., be reduced in size. For unit cells (first interpolation cells) with a driving strength $I_0$, the following exemplary binary cells (second interpolation cells) may, e.g., be implemented:

$\frac{1}{2}$ binary cell(s)$B_{1/2}$: $I_{B1/2}=I_0/2$      a)

$\frac{1}{4}$ binary cell(s)$B_{1/4}$: $I_{B1/4}=I_0/4$      b)

That is, the $2^M-1$ first interpolation cells may comprise a respective first output driver with a first drive strength, wherein the plurality of second interpolation cells may comprise respective second output drivers with drive strengths lower than the first drive strength. For example, the first output driver may comprise a first inverter circuit configured to supply the first current to the common node, wherein the second output drivers may comprise different second inverter circuits configured to supply the respective second currents to the common node.

Figure 6A:
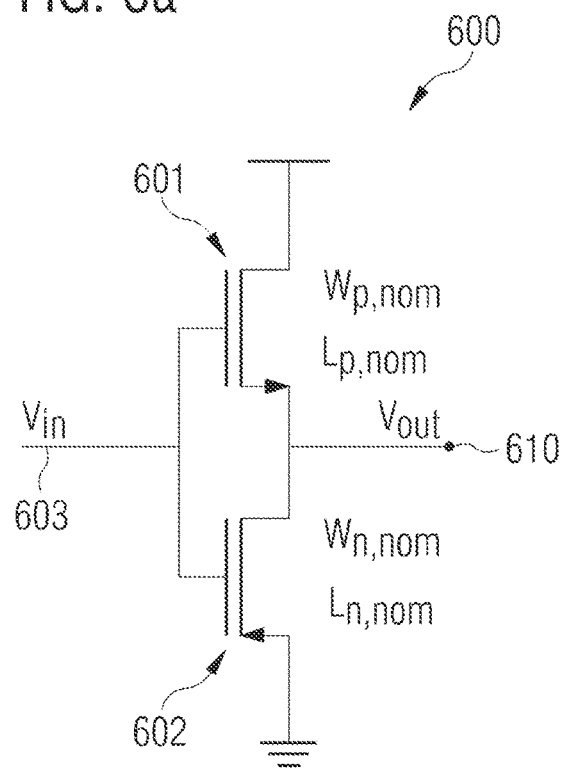
FIGS. 6a to 6d illustrate exemplary implementations for an output inverter of an interpolation cell.

These driving strengths may, e.g., be realized by changing the implementation of the unit cell's output inverter accordingly, while the remaining unit cell remains unchanged. FIG. 6a illustrates a first inverter circuit 600 of a first interpolation cell (unit cell). The first inverter circuit 600 comprises a first output node 610 arranged within a series connection of a first transistor 601 and a second transistor 602 of different conductivity types (e.g. p-type and n-type). The first output node is configured to supply the first current to the common node based on a first control signal 603 which is received by respective control gates of the first transistor 601 and the second transistor 602. As indicated in FIGS. 4 and 6a, the first control signal 603 may be the first and/or the second signal which is/are passed by the inverter circuits of the interpolation cell based on the control word.

Figure 6B:
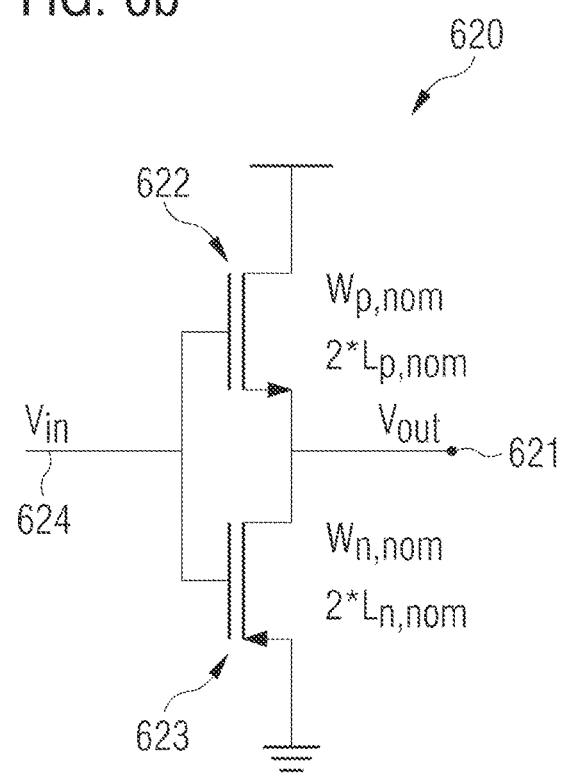

FIG. 6b illustrates a second inverter circuit 620 which comprises a second output 621 node arranged within a series connection of a third transistor 622 and a fourth transistor 623 of different conductivity types (e.g. p-type and n-type). The second output node 621 is configured to supply the respective second current to the common node based on a second control signal 624 which is received by respective control gates of the third transistor 622 and the fourth transistor 623. As indicated in FIGS. 4 and 6b, the second control signal 624 may be the first and/or the second signal which is/are passed by the inverter circuits of the interpolation cell based on the control word. That is, the structure of the second inverter circuit 620 is similar to the one of the first inverter circuit 600. However, a respective ratio of its gate length to its gate width for the third transistor 622 and/or the fourth transistor 623 is at least twice a respective ratio of its gate length to its gate width for the first transistor 601 and/or the second transistor 602. That is, the transistors of the second inverter circuit 620 may have at least twice the length, or at maximum half of the width of the transistors of the first inverter circuit 600.

Figure 6C:
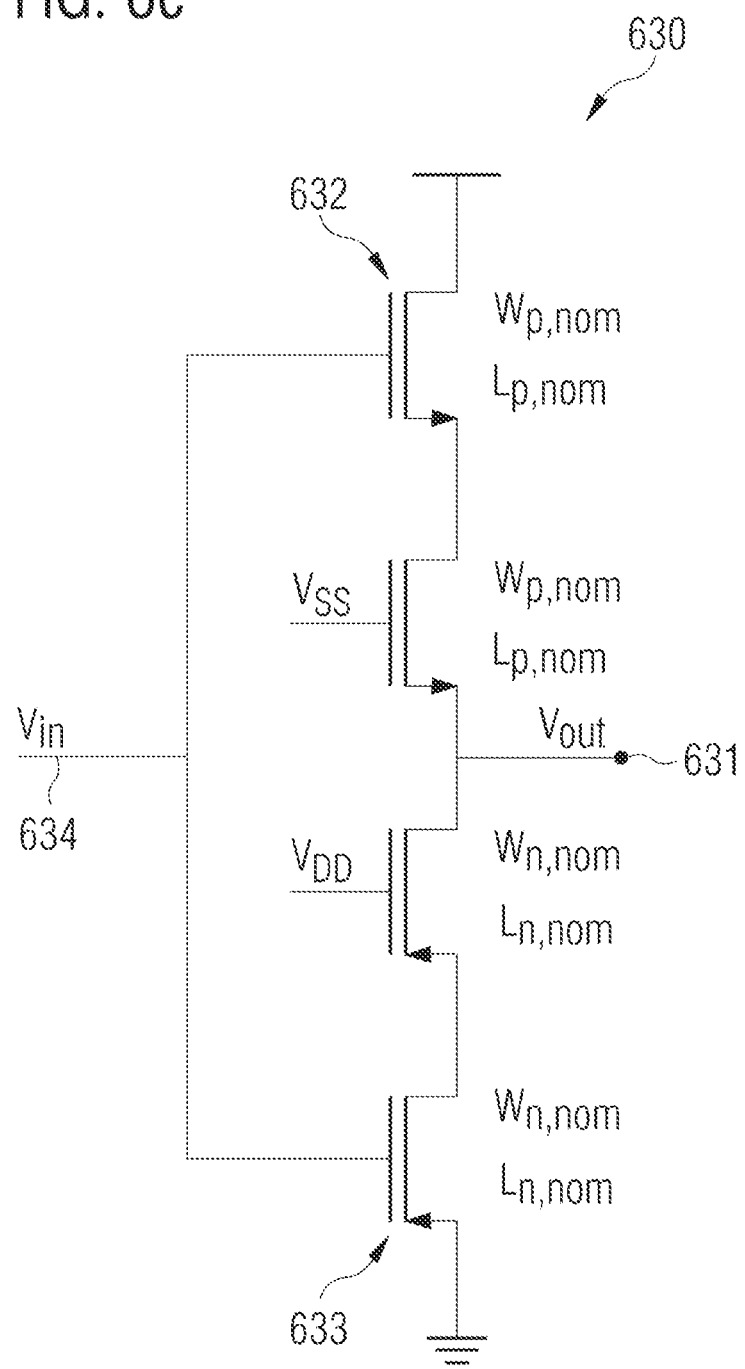

FIG. 6c illustrates another second inverter circuit 630 which comprises a second output 631 node arranged within a series connection of a third transistor 632 and a fourth transistor 633 of different conductivity types (e.g. p-type and n-type). The second output node 631 is configured to supply the respective second current to the common node based on a second control signal 634 which is received by respective control gates of the third transistor 632 and the fourth transistor 633. As indicated in FIGS. 4 and 6b, the second control signal 634 may be the first and/or the second signal which is/are passed by the inverter circuits of the interpolation cell based on the control word. In contrast to the second inverter circuit 620, the dimensions of the third transistor 632 and the fourth transistor 634 are not changed compared to the first transistor 601 and the second transistor 602, but the second inverter circuit 630 further comprises an even number of transistors (here: two) of different conductivity types which are coupled in series between the third transistor 632 and the fourth transistor 634 and are configured to receive constant potentials (e.g. VSS or VDD) at their respective control gates. As indicated in FIG. 6b, the even number of transistors may comprise equal numbers of transistors of the both conductivity types.

Figure 6D:
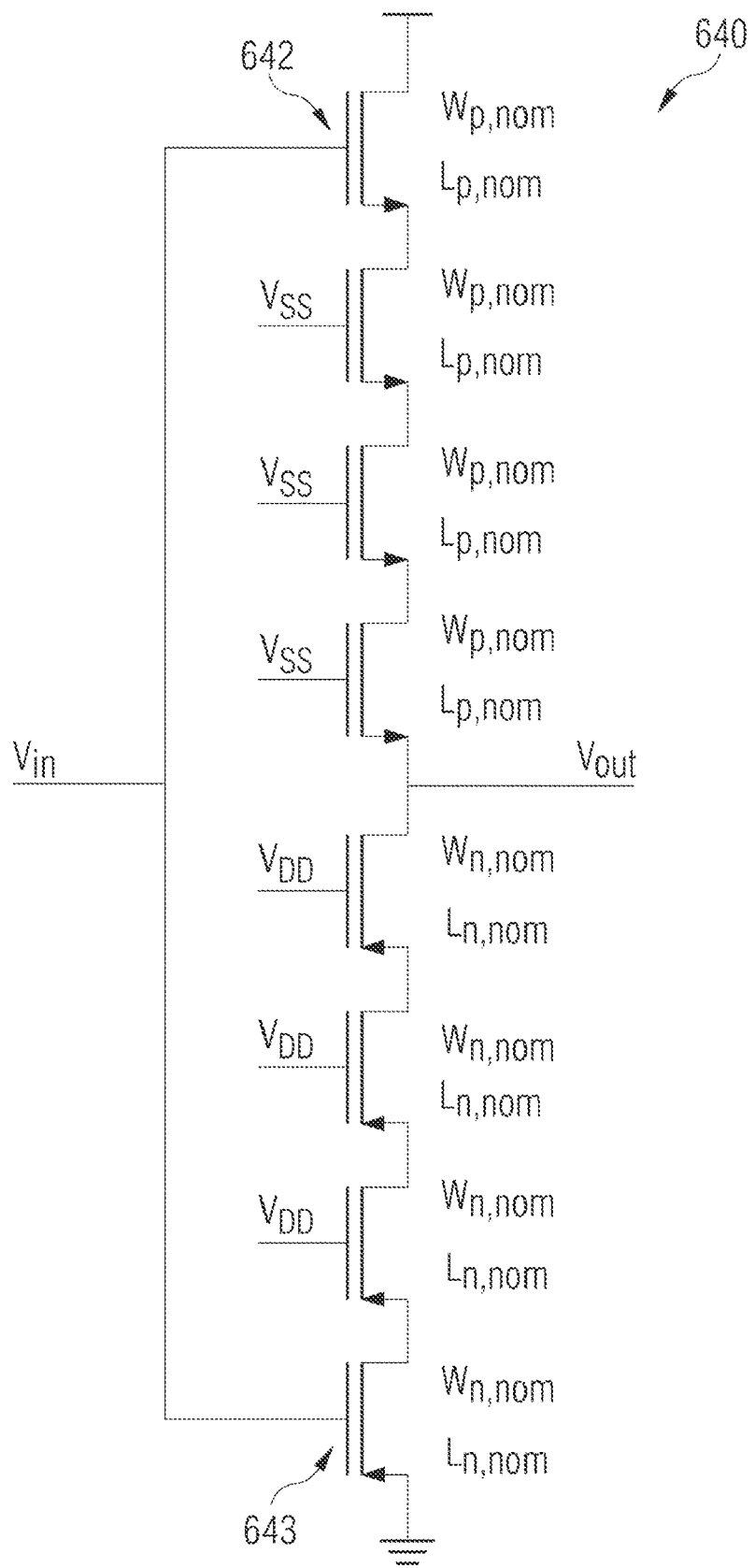

That is, half of the driving strength may, e.g., be achieved by adapting the driving strength through variation of the device length as illustrated in FIG. 6b, or by building a stack of equally sized inverters as illustrated in FIG. 6c. An example for further reduction of the driving strength is illustrated in FIG. 6d, which illustrates still another second inverter circuit 640 (a ¼ binary cell) comprising a larger transistor stack (with twice the number of transistor between the third transistor 642 and the fourth transistor 644) but a lower driving strength than the second inverter circuit 630. That is, the number of transistors coupled in series between the third transistor and the fourth transistor may be proportional to a ratio of the first current to the respective second current supplied by the second interpolation cell to the common node. In particular, the number T of transistors coupled in series between the third transistor and the fourth transistor may be based on an expression which is mathematically correspondent to $$T = 2\frac{I_1}{I_2} - 2, \quad (1)$$

with $I_1$ denoting the first current, and $I_2$ denoting the respective second current.

A phase interpolator according to the proposed concept or one or more examples described above may, e.g., be used in a DTC for phase interpolation.

Figure 7:
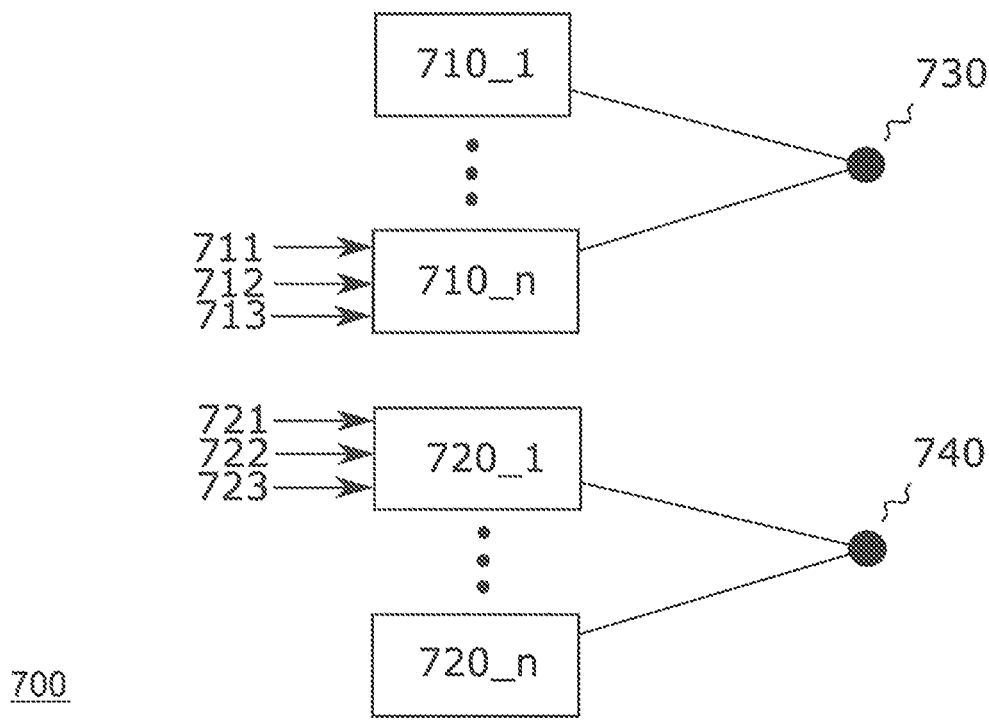
FIG. 7 illustrates an example of an apparatus for phase interpolation.

Another example of an apparatus 700 for phase interpolation is illustrated in FIG. 7. The apparatus 700 comprises a plurality of first interpolation cells 710_1, . . . , 710_n which are coupled to a first common node 730 of the apparatus 700. Further, the apparatus 700 comprises a plurality of second interpolation cells 720_1, . . . , 720_n coupled to a second common node 740 of the apparatus. At least one of the first plurality of interpolation cells 710_1, . . . , 710_n (e.g. interpolation cell 710_n) is configured to receive a first signal 711 of a first pseudo-differential signal pair and a first signal 712 of a second pseudo-differential signal pair, and to supply, based on a first control word 713, the first signal 711 of the first pseudo-differential signal pair and/or the first signal 712 of the second pseudo-differential signal pair to the first common node 730. At least one of the second plurality of interpolation cells 720_1, . . . , 720_n (e.g. interpolation cell 720_1) is configured to receive a second signal 721 of the first pseudo-differential signal pair and a second signal 722 of the second pseudo-differential signal pair, and to supply, based on a different second control word 723, the second signal 721 of the first pseudo-differential signal pair and/or the second signal 722 of the second pseudo-differential signal pair to the second common node 740.

The pseudo-differential approach of the apparatus 700 may allow separate control for the signals of the first and the second pseudo-differential signal pair. That is, different phase codes may be applied to the first/second signals of the pseudo-differential signal pairs. That is, the apparatus 700 may apply its phase shift only to one signal of the pseudo-differential signal pair, so that the effect on the pseudo-differential signal's phase is only about 50% compared to a situation where the same code is applied to both signals of the pseudo-differential signal pair.

A pseudo-differential signal pair is a pair of identical signals which are shifted in time by predetermined time shift. For example, a rising signal edge of the second signal 721 of the second pseudo-differential signal pair may be delayed by a predetermined time shift with respect to a rising signal edge of the first signal 711 of the second pseudo-differential signal pair.

Generally speaking, some examples relate to a means for phase interpolation. The means for phase interpolation comprises a plurality of first cellular means coupled to a first common node of the means for phase interpolation, and a plurality of second cellular means coupled to a second common node of the means for phase interpolation. At least one of the first plurality of cellular means is configured to receive a first signal of a first pseudo-differential signal pair and a first signal of a second pseudo-differential signal pair, and to supply, based on a first control word, the first signal of the first pseudo-differential signal pair and/or the first signal of the second pseudo-differential signal pair to the first common node. At least one of the second plurality of cellular means is configured to receive a second signal of the first pseudo-differential signal pair and a second signal of the second pseudo-differential signal pair, and to supply, based on a different second control word, the second signal of the first pseudo-differential signal pair and/or the second signal of the second pseudo-differential signal pair to the second common node.

For example, a rising signal edge of the second signal of the first pseudo-differential signal pair may be delayed by a predetermined time shift with respect to a rising signal edge of the first signal of the first pseudo-differential signal pair.

The means for phase interpolation may be implemented by an apparatus for phase interpolation described above or below (e.g. FIG. 7). The plurality of first cellular means may be implemented by a plurality of first interpolation cells described above or below (e.g. FIG. 7). The plurality of second cellular means may be implemented by a plurality of second interpolation cells described above or below (e.g. FIG. 7).

Figure 8:
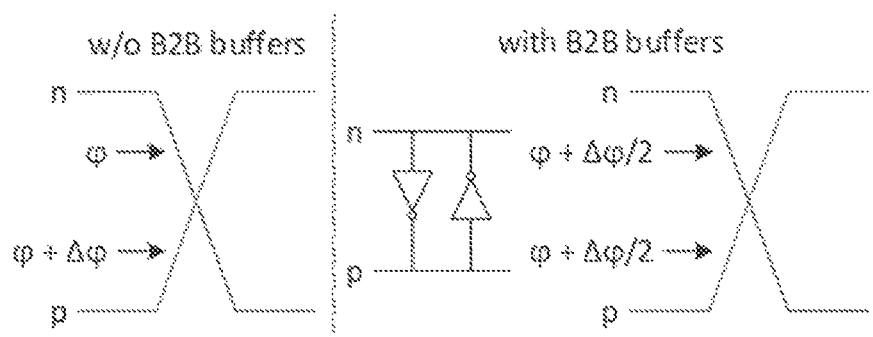
FIG. 8 illustrates an example of a phase relation.

The effect of applying different codes on one signal of the pseudo-differential signal pair is illustrated in FIG. 8. In the following, the two signals of the pseudo-differential signal pair are denoted as n signal and p signal. Using a pseudo-differential design may allow to binary bit implementation through separate control of n and p signal. This may allow the extension of an additional binary bit by only changing the control signals of an existing array. FIG. 8 gives an example how the different phase codes are applied to the differential signal. If different codes are applied on differential signals, the n signal and the p signal have different phases.

If the smallest cell, unit or binary cell, applies its phase shift Δφ only to either the n signal or the p signal, the effect on the differential signal's phase is ~50% compared to the same cell that applies the code on both the n signal and the p signal. Back to back (B2B) buffers between the differential signals may average out the slight difference of the differential signals. B2B average the phase between the n signal and the p signal, so that an effectively smaller phase step than the smallest implemented cell may be provided. This may allow double use of a cell as either unit cell and ½ binary cell, or as binary cell with weight $½^X$ and $½^{X+1}$.

Figure 9:
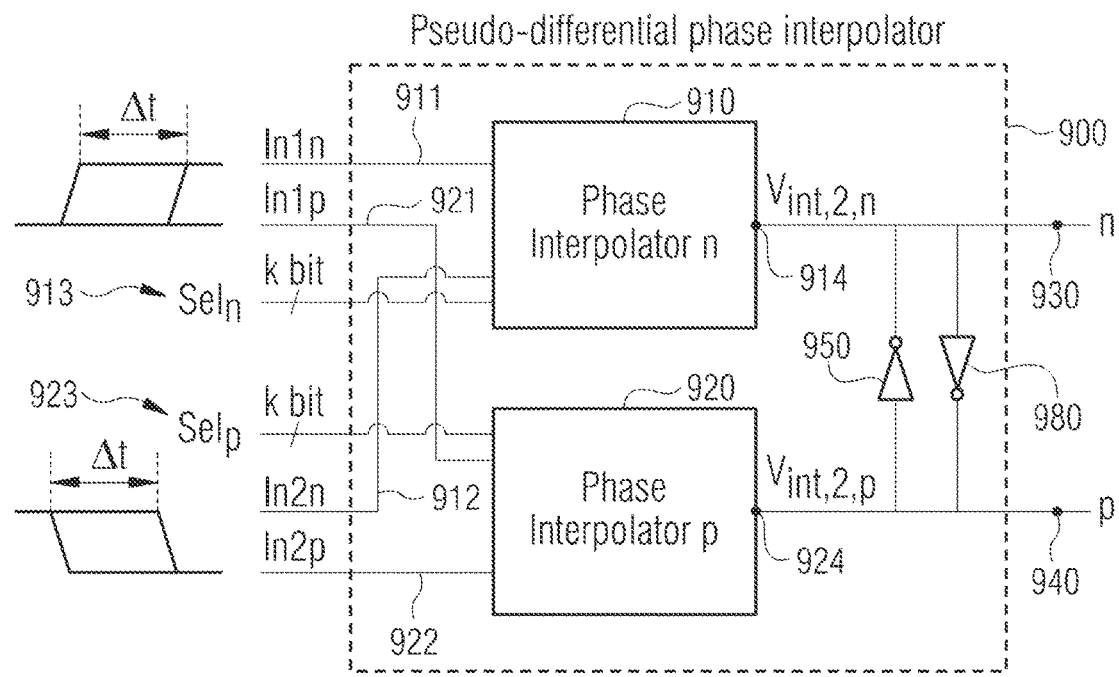
FIG. 9 illustrates another example of an apparatus for phase interpolation.

Another apparatus 900 for phase interpolation is illustrated in FIG. 9. The apparatus 900 comprises a first interpolation cell 910 which is coupled to a first common node 930 of the apparatus 900. Further, the apparatus 900 comprises a second interpolation cell 920 coupled to a second common node 940 of the apparatus 900. The first interpolation cells 910 receives a first signal 911 of a first pseudo-differential signal pair and a first signal 912 of a second pseudo-differential signal pair, and supplies, based on a first control word 913, the first signal 911 of the first pseudo-differential signal pair and/or the first signal 912 of the second pseudo-differential signal pair to the first common node 930. The second interpolation cell 920 receives a second signal 921 of the first pseudo-differential signal pair and a second signal 922 of the second pseudo-differential signal pair, and supplies, based on a different second control word 923, the second signal 921 of the first pseudo-differential signal pair and/or the second signal 922 of the second pseudo-differential signal pair to the second common node 940.

As indicated in FIG. 9, a pseudo-differential signal pair is a pair of identical signals which are shifted in time by predetermined time shift. The rising signal edge of the second signal 921 of the first pseudo-differential signal pair is delayed by a predetermined time shift Δt with respect to a rising signal edge of the first signal 911 of the first pseudo-differential signal pair. The falling signal edge of the second signal 922 of the second pseudo-differential signal pair is delayed by the predetermined time shift Δt with respect to a falling signal edge of the first signal 912 of the second pseudo-differential signal pair.

The apparatus 900 may comprise further (first/second) interpolation cells coupled to the first or the second common node 930, 940 as described above with respect to FIG. 7.

The apparatus 900 further comprises two cross-coupled inverters 950, 960 coupled between output nodes 914, 924 of the first interpolation cell 910 and the second interpolation cell 920.

The two cross-coupled inverters 950, 960 may serve as B2B buffers between the signals of the pseudo-differential signal pairs.

Optionally, the apparatus 900 may further comprise a first output inverter (not illustrated) coupled between the first common node 930 and a first output node (not illustrated) of the apparatus 900, and a second output inverter (not illustrated) coupled between the second common node 940 and a second output node (not illustrated) of the apparatus 900.

Figure 10:
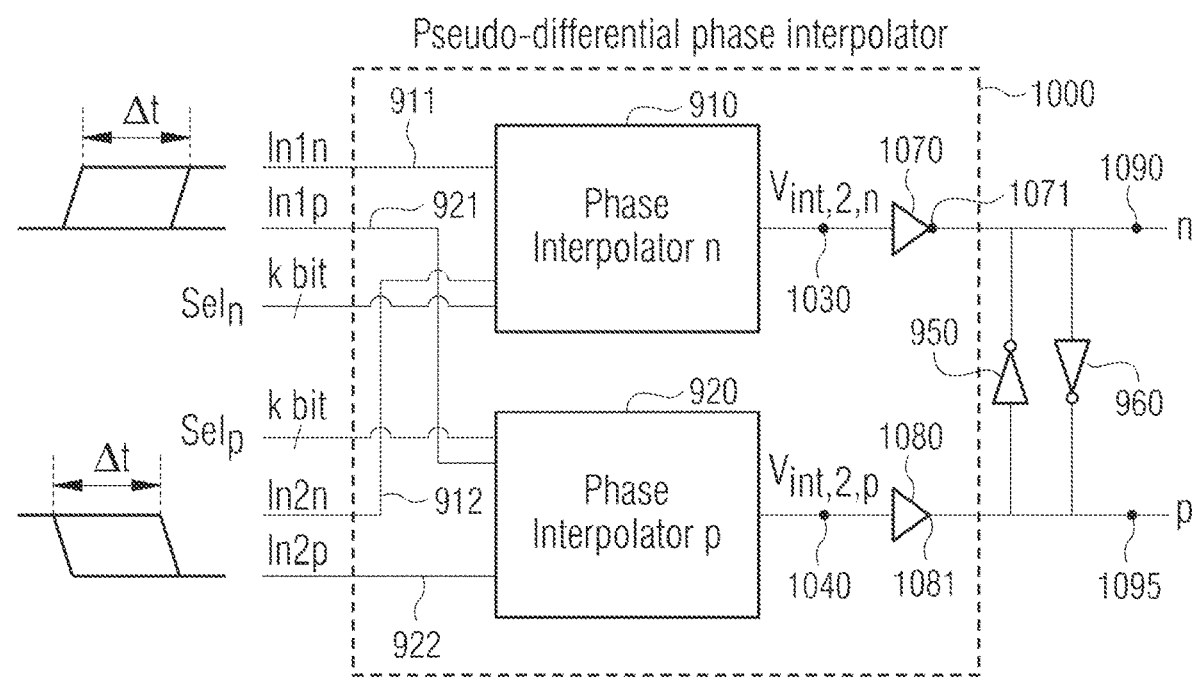
FIG. 10 illustrates still another example of an apparatus for phase interpolation.

Still another apparatus 1000 for phase interpolation is illustrated in FIG. 10. The apparatus 1000 is similar to the apparatus 900 illustrated in FIG. 9. However, the arrangement of the cross-coupled inverters 950, 960 is different.

In contrast to the apparatus 900 illustrated in FIG. 9, the apparatus 1000 comprises a first output inverter 1070 coupled between the first common node 1030 and a first output node 1090 of the apparatus 1000, and a second output inverter 1080 coupled between the second common node 1040 and a second output node 1095 of the apparatus 1000. In the apparatus 1000 the two cross-coupled inverters 950, 960 are coupled between output nodes 1071, 1081 of the first output inverter 1070 and the second output inverter 1080.

It is evident from FIGS. 9 and 10, that the B2B buffers (here the cross-coupled inverters 950, 960) may be arranged between any differential nodes downstream of the interpolation cells.

An apparatus for phase interpolation according to the proposed concept or one or more examples described above may, e.g., be used in a DTC for phase interpolation.

Figure 11:
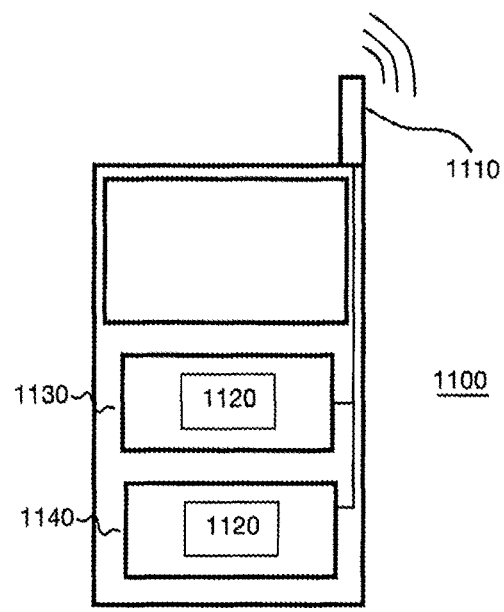
FIG. 11 illustrates an example of a mobile device comprising a DTC.

An example of an implementation using a DTC according to one or more aspects of the proposed concept or one or more examples described above is illustrated in FIG. 11. FIG. 11 schematically illustrates an example of a mobile device 1100 (e.g. mobile phone, smartphone, tablet-computer, or laptop) comprising a DTC 1120 according to an example described herein. The DTC 1120 may, e.g., be comprised by a transmitter 1130, or a receiver 1140. An antenna element 1110 of the mobile device 1100 may be coupled to the transmitter 1430 transmitter 1130 and/or the receiver 1140. To this end, mobile devices may be provided with DTCs having increased phase resolution at minimum power consumption overhead.

Figure 12:
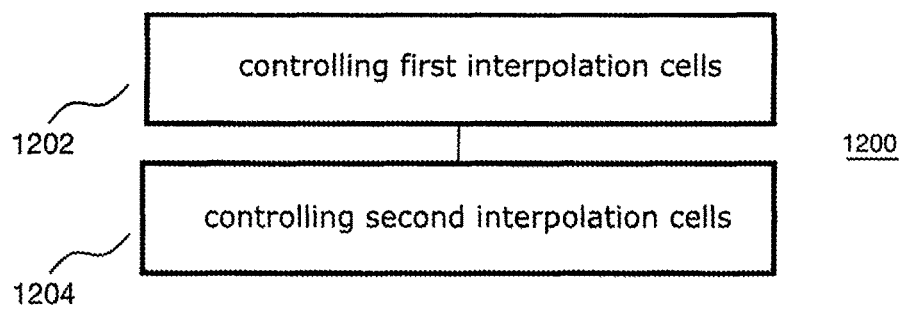
FIG. 12 illustrates a flowchart of an example of a method for phase interpolation.

An example of a method 1200 for phase interpolation with (M+N) bit resolution is illustrated by means of a flowchart in FIG. 12. The method 1200 comprises controlling 1202 a plurality of first interpolation cells to supply a first current to a common node, respectively. Further, the method 1200 comprises controlling 1204 a plurality of second interpolation cells to supply a second current to the common node, respectively. The second current is lower than the first current. A sum of the plurality of second currents supplied to the common node by the plurality of second interpolation cells is (substantially) equal to the first current.

More details and aspects of the method are mentioned in connection with the proposed concept or one or more examples described above (e.g. FIGS. 1-6). The method may comprise one or more additional optional features corresponding to one or more aspects of the proposed concept or one or more examples described above.

Figure 13:
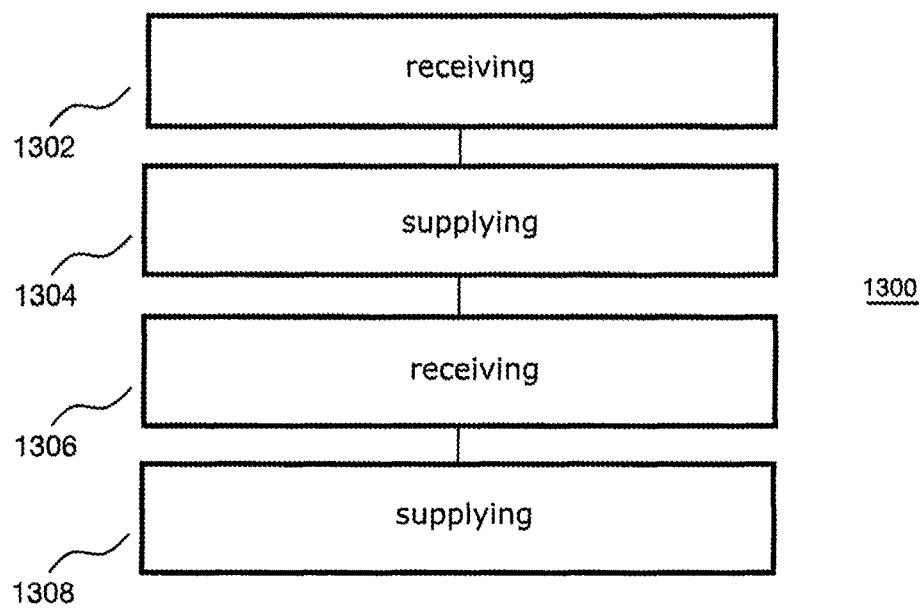
FIG. 13 illustrates a flowchart of an example of a method for phase interpolation.

An example of a method 1300 for phase interpolation is illustrated by means of a flowchart in FIG. 13. In this respect, a plurality of first interpolation cells is coupled to a first common node, and a plurality of second interpolation cells coupled to a second common node. The method 1300 comprises receiving 1302 a first signal of a first pseudo-differential signal pair and a first signal of a second pseudo-differential signal pair by at least one of the first plurality of interpolation cells. Further, the method 1300 comprises supplying 1304, based on a first control word, the first signal of the first pseudo-differential signal pair and/or the first signal of the second pseudo-differential signal pair to the first common node by the at least one of the first plurality of interpolation cells. The method 1300 also comprises receiving 1306 a second signal of the first pseudo-differential signal pair and a second signal of the second pseudo-differential signal pair by at least one of the second plurality of interpolation cells. Additionally, the method 1300 comprises supplying 1308, based on a different second control word, the second signal of the first pseudo-differential signal pair and/or the second signal of the second pseudo-differential signal pair to the second common node by the at least one of the second plurality of interpolation cells.

More details and aspects of the method are mentioned in connection with the proposed concept or one or more examples described above (e.g. FIGS. 7-10). The method may comprise one or more additional optional features corresponding to one or more aspects of the proposed concept or one or more examples described above.

The examples as described herein may be summarized as follows:

Example 1 is a phase interpolator, comprising: a plurality of first interpolation cells each configured to supply a first current to a common node (130) of the phase interpolator; and a plurality of second interpolation cells each configured to supply a second current to the common node, wherein the second current is lower than the first current, and wherein a sum of the plurality of the second currents supplied to the common node by the plurality of second interpolation cells is substantially equal to the first current.

In example 2, the second current is at maximum 50% of the first current in the phase interpolator of example 1.

In example 3, the number of first interpolation cells in the phase interpolator of example 1 or example 2 is greater than the number of second interpolation cells.

In example 4, the phase interpolator of any of the preceding examples further comprises: a control circuit configured to control the plurality of first interpolation cells based on a number of most significant bits of a control word, and to control the plurality of second interpolation cells based on a number of least significant bits of the control word and a bit of the control word that indicates a direction of interpolation.

In example 5, the control circuit in the phase interpolator of example 4 is further configured to control a first second interpolation cell based on the bit of the control word that indicates the direction of interpolation, and to control a second interpolation cell based on a combination of the number of least significant bits of the control word and the bit of the control word that indicates the direction of interpolation.

In example 6, the control circuit in the phase interpolator of example 4 is further configured to control a first second interpolation cell based on the bit of the control word that indicates the direction of interpolation, and to control a second interpolation cell based on the number of least significant bits of the control word.

In example 7, the first second interpolation cell in the phase interpolator of example 6 is the second interpolation cell supplying the lowest current to the common node.

In example 8, the plurality of second currents supplied by the plurality of second interpolation cells to the common node in the phase interpolator of any of examples 1 to 5 are substantially equal to one another.

In example 9, the respective second currents supplied by the plurality of second interpolation cells to the common node in the phase interpolator of any of examples 1 to 4, 6 or 7 are different.

In example 10, the plurality of second interpolation cells in the phase interpolator of any of examples 1 to 4, 6, 7 or 9 comprises two second interpolation cells configured to supply second currents to the common node that are $2^{-S}$ times the first current, wherein S+1 is the number of second interpolation cells, and wherein the plurality of second interpolation cells further comprises for each natural number Y being equal to or less than S−1 one respective second interpolation cell configured to supply a second current to the common node which is $2^{-Y}$ times the first current.

In example 11, the plurality of first interpolation cells in the phase interpolator of any of the preceding examples comprises a respective first output driver with a first drive strength, and wherein the plurality of second interpolation cells comprise respective second output drivers with drive strengths lower than the first drive strength.

In example 12, the first output driver in the phase interpolator of example 11 comprises a first inverter circuit configured to supply the first current to the common node, and wherein the second output drivers comprise different second inverter circuits configured to supply the respective second currents to the common node.

In example 13, the first inverter circuit in the phase interpolator of example 12 comprises a first output node arranged within a series connection of a first transistor and a second transistor of different conductivity types, wherein the first output node is configured to supply the first current to the common node based on a first control signal which is received by respective control gates of the first transistor and the second transistor.

In example 14, at least one of the second inverter circuits in the phase interpolator of example 13 comprises a second output node arranged within a series connection of a third transistor and a fourth transistor of different conductivity types, wherein the second output node is configured to supply the respective second current to the common node based on a second control signal which is received by respective control gates of the third transistor and the fourth transistor, and wherein a respective ratio of its gate length to its gate width for the third transistor and/or the fourth transistor is at least twice a respective ratio of its gate length to its gate width for the first transistor and/or the second transistor.

In example 15, at least one of the second inverter circuits in the phase interpolator of example 13 comprises a second output node arranged within a series connection of a third transistor and a fourth transistor of different conductivity types, wherein the second output node is configured to supply the respective second current to the common node based on a second control signal which is received by respective control gates of the third transistor and the fourth transistor, and wherein the second inverter circuit further comprises an even number of transistors of different conductivity types which are coupled in series between the third transistor and the fourth transistor and are configured to receive constant potentials at their respective control gates.

In example 16, the number of transistors coupled in series between the third transistor and the fourth transistor in the phase interpolator of example 15 is proportional to a ratio of the first current to the respective second current to the common node.

In example 17, the number T of transistors coupled in series between the third transistor and the fourth transistor in the phase interpolator of example 15 or example 16 is based on an expression which is mathematically correspondent to $$T = 2\frac{I_1}{I_2} - 2,$$

with $I_1$ denoting the first current, and $I_2$ denoting the respective second current.

Example 18 is an apparatus for phase interpolation, comprising: a plurality of first interpolation cells coupled to a first common node of the apparatus; and a plurality of second interpolation cells coupled to a second common node of the apparatus, wherein at least one of the first plurality of interpolation cells is configured to receive a first signal of a first pseudo-differential signal pair and a first signal of a second pseudo-differential signal pair, and to supply, based on a first control word, the first signal of the first pseudo-differential signal pair or the first signal of the second pseudo-differential signal pair to the first common node, and wherein at least one of the second plurality of interpolation cells is configured to receive a second signal of the first pseudo-differential signal pair and a second signal of the second pseudo-differential signal pair, and to supply, based on a different second control word, the second signal of the first pseudo-differential signal pair and/or the second signal of the second pseudo-differential signal pair to the second common node.

In example 19, the apparatus of example 18 further comprises two cross-coupled inverters coupled between output nodes of the one of the first plurality of interpolation cells and the one of the second plurality of interpolation cells.

In example 20, the apparatus of example 18 or example 19 further comprises: a first output inverter coupled between the first common node and a first output node of the apparatus; and a second output inverter coupled between the second common node and a second output node of the apparatus.

In example 21, the apparatus of example 18 further comprises: a first output inverter coupled between the first common node and a first output node of the apparatus; a second output inverter coupled between the second common node and a second output node of the apparatus; and two cross-coupled inverters coupled between output nodes of the first output inverter and the second output inverter.

In example 22, a rising signal edge of the second signal of the first pseudo-differential signal pair is delayed by a predetermined time shift with respect to a rising signal edge of the first signal of the first pseudo-differential signal pair in the apparatus of any of examples 18 to 21.

Example 23 is a digital-to-time converter comprising a phase interpolator according to any of examples 1 to 17, or an apparatus for phase interpolation according to any of examples 18 to 22.

Example 24 is a transmitter comprising a digital-to-time converter according example 23.

Example 25 is a receiver comprising a digital-to-time converter according to example 23.

Example 26 is a mobile device comprising a transmitter according to example 24, or a receiver according to example 25.

In example 27, the mobile device of example 26 further comprises at least one antenna element coupled to the transmitter, or to the receiver.

Example 28 is a means for phase interpolation, comprising: a plurality of first cellular means for supplying a first current to a common node of the means for phase interpolation, respectively; and a plurality of second cellular means for supplying a second current to the common node, respectively, wherein the second current is lower than the first current, and wherein a sum of the plurality of second currents supplied to the common node by the plurality of second cellular means is substantially equal to the first current.

In example 29, the number of first cellular means is greater than the number of second cellular means in the means for phase interpolation of example 28.

Example 30 is a means for phase interpolation, comprising: a plurality of first cellular means coupled to a first common node of the means for phase interpolation; and a plurality of second cellular means coupled to a second common node of the means for phase interpolation, wherein at least one of the first plurality of cellular means is configured to receive a first signal of a first pseudo-differential signal pair and a first signal of a second pseudo-differential signal pair, and to supply, based on a first control word, the first signal of the first pseudo-differential signal pair and/or the first signal of the second pseudo-differential signal pair to the first common node, and wherein at least one of the second plurality of cellular means is configured to receive a second signal of the first pseudo-differential signal pair and a second signal of the second pseudo-differential signal pair, and to supply, based on a different second control word, the second signal of the first pseudo-differential signal pair or the second signal of the second pseudo-differential signal pair to the second common node.

In example 31, a rising signal edge of the second signal of the first pseudo-differential signal pair is delayed by a predetermined time shift with respect to a rising signal edge of the first signal of the first pseudo-differential signal pair in the means for phase interpolation of example 30.

Example 32 is a method for phase interpolation, comprising: controlling a plurality of first interpolation cells to supply a first current to a common node, respectively; and controlling a plurality of second interpolation cells to supply a second current to the common node, respectively, wherein the second current is lower than the first current, and wherein a sum of the plurality of second currents supplied to the common node by the plurality of second interpolation cells is substantially equal to the first current.

In example 33, the second current is at maximum 50% of the first current in the method of example 32.

In example 34, the number of first interpolation cells is greater than the number of second interpolation cells in the method of example 32 or example 33.

In example 35, controlling the plurality of first interpolation cells in the method of any of the preceding examples is based on a number of most significant bits of a control word, wherein controlling the plurality of second interpolation cells is based on a number of least significant bits of the control word and a bit of the control word that indicates a direction of interpolation.

In example 36, controlling the plurality of second interpolation cells in the method of example 35 comprises: controlling a first second interpolation cell based on the bit of the control word that indicates the direction of interpolation; and controlling a second interpolation cell based on a combination of the number of least significant bits of the control word and the bit of the control word that indicates the direction of interpolation.

In example 37, controlling the plurality of second interpolation cells in the method of example 35 comprises: controlling a first second interpolation cell based on the bit of the control word that indicates the direction of interpolation; and controlling a second interpolation cell based on the number of least significant bits of the control word.

In example 38, the first second interpolation cells is the second interpolation cell supplying the lowest current to the common node in the method of example 37.

In example 39, the plurality of second currents supplied by the plurality of second interpolation cells to the common node are substantially equal to one another in the method of any of examples 32 to 36.

In example 40, the respective second currents supplied by the plurality of second interpolation cells to the common node are different in the method of any of examples 32 to 35, 37 or 38.

In example 41, controlling the plurality of second interpolation cells in the method of any of examples 32 to 35, 37, 38 or 40 comprises: controlling two second interpolation cells to supply second currents to the common node that are $2^{-S}$ times the first current, wherein S+1 is the number of second interpolation cells; and controlling a natural number Y of second interpolation cells being equal to or less than S−1 to supply a second current to the common node which is $2^{-Y}$ times the first current.

Example 42 is a method for phase interpolation, wherein a plurality of first interpolation cells is coupled to a first common node, wherein a plurality of second interpolation cells coupled to a second common node, and wherein the method comprises: receiving a first signal of a first pseudo-differential signal pair and a first signal of a second pseudo-differential signal pair by at least one of the first plurality of interpolation cells; supplying, based on a first control word, the first signal of the first pseudo-differential signal pair and/or the first signal of the second pseudo-differential signal pair to the first common node by the at least one of the first plurality of interpolation cells; receiving a second signal of the first pseudo-differential signal pair and a second signal of the second pseudo-differential signal pair by at least one of the second plurality of interpolation cells; and supplying, based on a different second control word, the second signal of the first pseudo-differential signal pair or the second signal of the second pseudo-differential signal pair to the second common node by the at least one of the second plurality of interpolation cells.

In example 43, a rising signal edge of the second signal of the first pseudo-differential signal pair is delayed by a predetermined time shift with respect to a rising signal edge of the first signal of the first pseudo-differential signal pair in the method of example 42.

Example 44 is a computer readable storage medium having stored thereon a program having a program code for performing the method of any of examples 32 to 41 or the method of examples 42 and 43, when the program is executed on a computer or processor.

Example 45 is a computer program having a program code configured to perform the method of any of examples 32 to 41 or the method of examples 42 and 43, when the computer program is executed on a computer or processor.

The aspects and features mentioned and described together with one or more of the previously detailed examples and figures, may as well be combined with one or more of the other examples in order to replace a like feature of the other example or in order to additionally introduce the feature to the other example.

Examples may further be or relate to a computer program having a program code for performing one or more of the above methods, when the computer program is executed on a computer or processor. Steps, operations or processes of various above-described methods may be performed by programmed computers or processors. Examples may also cover program storage devices such as digital data storage media, which are machine, processor or computer readable and encode machine-executable, processor-executable or computer-executable programs of instructions. The instructions perform or cause performing some or all of the acts of the above-described methods. The program storage devices may comprise or be, for instance, digital memories, magnetic storage media such as magnetic disks and magnetic tapes, hard drives, or optically readable digital data storage media. Further examples may also cover computers, processors or control units programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. Furthermore, all examples recited herein are principally intended expressly to be only for pedagogical purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

A functional block denoted as "means for . . . " performing a certain function may refer to a circuit that is configured to perform a certain function. Hence, a "means for s.th." may be implemented as a "means configured to or suited for s.th.", such as a device or a circuit configured to or suited for the respective task.

Functions of various elements shown in the figures, including any functional blocks labeled as "means", "means for providing a sensor signal", "means for generating a transmit signal.", etc., may be implemented in the form of dedicated hardware, such as "a signal provider", "a signal processing unit", "a processor", "a controller", etc. as well as hardware capable of executing software in association with appropriate software. When provided by a processor, the functions may be provided by a single dedicated processor, by a single shared processor, or by a plurality of individual processors, some of which or all of which may be shared. However, the term "processor" or "controller" is by far not limited to hardware exclusively capable of executing software, but may include digital signal processor (DSP) hardware, network processor, application specific integrated circuit (ASIC), field programmable gate array (FPGA), read only memory (ROM) for storing software, random access memory (RAM), and nonvolatile storage. Other hardware, conventional and/or custom, may also be included.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. A phase interpolator, comprising:
a plurality of first interpolation cells each configured to supply a first current with a first strength to a common node of the phase interpolator; and
a plurality of second interpolation cells each configured to supply a second current to the common node, wherein a strength of the second current is lower than a strength of the first current, and wherein a sum of the plurality of the second currents supplied to the common node by the plurality of second interpolation cells is substantially equal to the first current in case where all second interpolation cells are turned on.

2. The phase interpolator of claim 1, wherein the strength of the second current is at maximum 50% of the strength of the first current.

3. The phase interpolator of claim 1, wherein the number of first interpolation cells is greater than the number of second interpolation cells.

4. The phase interpolator of claim 1, further comprising:
a control circuit configured to control the plurality of first interpolation cells based on a number of most significant bits of a control word, and to control the plurality of second interpolation cells based on a number of least significant bits of the control word and a bit of the control word that indicates a direction of interpolation.

5. The phase interpolator of claim 4, wherein the control circuit is further configured to control a first second interpolation cell based on the bit of the control word that indicates the direction of interpolation, and to control a second interpolation cell based on a combination of the number of least significant bits of the control word and the bit of the control word that indicates the direction of interpolation.

6. The phase interpolator of claim 4, wherein the control circuit is further configured to control a first second interpolation cell based on the bit of the control word that indicates the direction of interpolation, and to control a second interpolation cell based on the number of least significant bits of the control word.

7. The phase interpolator of claim 6, wherein the first second interpolation cell is the second interpolation cell supplying the lowest current to the common node.

8. The phase interpolator of claim 1, wherein the plurality of second currents supplied by the plurality of second interpolation cells to the common node are substantially equal to one another.

9. The phase interpolator of claim 1, wherein the respective second currents supplied by the plurality of second interpolation cells to the common node are different.

10. The phase interpolator of claim 1, wherein the plurality of second interpolation cells comprises two second interpolation cells configured to supply second currents to the common node that are $2^{-S}$ times the first current, wherein S+1 is the number of second interpolation cells, and wherein the plurality of second interpolation cells further comprises for each natural number Y being equal to or less than S−1 one respective second interpolation cell configured to supply a second current to the common node which is $2^{-Y}$ times the first current.

11. The phase interpolator of claim 1, wherein the plurality of first interpolation cells comprises a respective first output driver with a first drive strength, and wherein the plurality of second interpolation cells comprise respective second output drivers with drive strengths lower than the first drive strength.

12. The phase interpolator of claim 11, wherein the first output driver comprises a first inverter circuit configured to supply the first current to the common node, and wherein the second output drivers comprise different second inverter circuits configured to supply the respective second currents to the common node.

13. The phase interpolator of claim 12, wherein the first inverter circuit comprises a first output node arranged within a series connection of a first transistor and a second transistor of different conductivity types, wherein the first output node is configured to supply the first current to the common node based on a first control signal which is received by respective control gates of the first transistor and the second transistor.

14. The phase interpolator of claim 13, wherein at least one of the second inverter circuits comprises a second output node arranged within a series connection of a third transistor and a fourth transistor of different conductivity types, wherein the second output node is configured to supply the respective second current to the common node based on a second control signal which is received by respective control gates of the third transistor and the fourth transistor, and wherein a respective ratio of its gate length to its gate width for the third transistor and/or the fourth transistor is at least twice a respective ratio of its gate length to its gate width for the first transistor and/or the second transistor.

15. The phase interpolator of claim 13, wherein at least one of the second inverter circuits comprises a second output node arranged within a series connection of a third transistor and a fourth transistor of different conductivity types, wherein the second output node is configured to supply the respective second current to the common node based on a second control signal which is received by respective control gates of the third transistor and the fourth transistor, and wherein the second inverter circuit further comprises an even number of transistors of different conductivity types which are coupled in series between the third transistor and the fourth transistor and are configured to receive constant potentials at their respective control gates.

16. The phase interpolator of claim 15, wherein the number of transistors coupled in series between the third transistor and the fourth transistor is proportional to a ratio of the first current to the respective second current to the common node.

17. A digital-to-time converter comprising a phase interpolator according to claim 1.

18. A method for phase interpolation, comprising:
controlling a plurality of first interpolation cells to supply a first current with a first strength to a common node, respectively; and
controlling a plurality of second interpolation cells to supply a second current with a second strength to the common node, respectively, wherein a strength of the second current is lower than a strength of the first current, and wherein a sum of the plurality of second currents supplied to the common node by the plurality of second interpolation cells is substantially equal to the first current in case where all second interpolation cells are turned on.

19. The method of claim 18, wherein the number of first interpolation cells is greater than the number of second interpolation cells.

20. The method of claim 18, wherein controlling the plurality of first interpolation cells is based on a number of most significant bits of a control word, and wherein controlling the plurality of second interpolation cells is based on a number of least significant bits of the control word and a bit of the control word that indicates a direction of interpolation.

* * * * *